United States Patent
Watanabe et al.

(10) Patent No.: US 10,081,073 B2
(45) Date of Patent: Sep. 25, 2018

(54) SPOT WELDED JOINT

(71) Applicant: NIPPON STEEL & SUMITOMO METAL CORPORATION, Tokyo (JP)

(72) Inventors: Fuminori Watanabe, Tokyo (JP); Tomohito Tanaka, Tokyo (JP); Seiji Furusako, Tokyo (JP); Yasunobu Miyazaki, Tokyo (JP); Hideki Hamatani, Tokyo (JP); Hatsuhiko Oikawa, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 192 days.

(21) Appl. No.: 14/395,970

(22) PCT Filed: Apr. 25, 2013

(86) PCT No.: PCT/JP2013/062198
§ 371 (c)(1),
(2) Date: Oct. 21, 2014

(87) PCT Pub. No.: WO2013/161937
PCT Pub. Date: Oct. 31, 2013

(65) Prior Publication Data
US 2015/0104243 A1 Apr. 16, 2015

(30) Foreign Application Priority Data

Apr. 25, 2012 (JP) .................... 2012-100324

(51) Int. Cl.
*B23K 11/11* (2006.01)
*B23K 11/16* (2006.01)
(Continued)

(52) U.S. Cl.
CPC ............ *B23K 11/16* (2013.01); *B23K 11/11* (2013.01); *C22C 38/001* (2013.01);
(Continued)

(58) Field of Classification Search
CPC ............ Y10T 403/477; Y10T 403/478; Y10T 403/479; B23K 2203/04; B23K 33/00;
(Continued)

(56) References Cited

U.S. PATENT DOCUMENTS 3,082,315 A * 3/1963 Johnson ................ B23K 9/007
219/127
3,496,326 A * 2/1970 Brubaker ............. B23K 11/163
219/104

(Continued)

FOREIGN PATENT DOCUMENTS

CN 1208680 A 2/1999
CN 102137730 A 7/2011
(Continued)

OTHER PUBLICATIONS

Translation WO 2011/025015 A1 (First Page of Translation to show details of text availability). https://worldwide.espacenet.com/publicationDetails/description?CC=WO&NR=2011025015A1&KC=A1&FT=D&ND=4&date=20110303&DB=&locale=en_EP. Accessed Aug. 30, 2016.*

(Continued)

*Primary Examiner* — Ryan D Kwiecinski
(74) *Attorney, Agent, or Firm* — Birch, Stewart, Kolasch & Birch, LLP

(57) ABSTRACT

In a spot welded joint according to an aspect of the present invention, with respect to a rectangular planar region of 100 μm×100 μm which is perpendicular to a sheet surface of the plurality of the steel sheets and which centers around an inner point spaced away by 100 μm in a direction parallel with the sheet surface from an edge of a nugget, in a case of measuring a P concentration at a pitch of 1 μm to obtain measured values of the P concentration at 100×100 of measurement points, and in a case of repetitively calculating an average value of the measured values of the P concen- (Continued)

tration at 20 of the measurement points which are adjacent to each other and which are arranged in a row in the direction parallel with the sheet surface among the 100×100 of the measurement points while shifting each one point to obtain 81×100 of the average values, the number of the average values which are more than two times an average P concentration is 0 to 100.

3 Claims, 7 Drawing Sheets

(51) Int. Cl.
| | |
|---|---|
| C22C 38/00 | (2006.01) |
| C22C 38/02 | (2006.01) |
| C22C 38/04 | (2006.01) |
| C22C 38/06 | (2006.01) |

(52) U.S. Cl.
CPC ............ *C22C 38/002* (2013.01); *C22C 38/02* (2013.01); *C22C 38/04* (2013.01); *C22C 38/06* (2013.01); *H01L 2924/01015* (2013.01); *Y10T 403/478* (2015.01)

(58) Field of Classification Search
CPC .................... B23K 11/11; B23K 11/16; H01L 2924/01015
USPC .......................................... 403/270, 271, 272
See application file for complete search history.

(56) References Cited

U.S. PATENT DOCUMENTS

| | | | | |
|---|---|---|---|---|
| 5,783,794 | A * | 7/1998 | Oikawa ................. | B23K 11/115 |
| | | | | 219/118 |
| 6,140,825 | A | 10/2000 | Fujii et al. | |
| 7,473,864 | B2 * | 1/2009 | Iwase ..................... | B23K 11/20 |
| | | | | 219/118 |
| 8,820,615 | B2 * | 9/2014 | Dahlman ................. | C21D 1/18 |
| | | | | 228/200 |
| 9,228,244 | B2 * | 1/2016 | Takeda .................... | C21D 6/00 |
| 2005/0247679 | A1 * | 11/2005 | Wang .................. | B23K 11/3009 |
| | | | | 219/117.1 |
| 2007/0199924 | A1 * | 8/2007 | Yoshida .................. | B23K 11/11 |
| | | | | 219/109 |
| 2007/0269678 | A1 * | 11/2007 | Ono ....................... | B23K 11/16 |
| | | | | 428/659 |
| 2011/0008648 | A1 * | 1/2011 | Okitsu ..................... | B23K 9/23 |
| | | | | 428/683 |
| 2012/0126780 | A1 | 5/2012 | Watanabe et al. | |
| 2012/0141829 | A1 * | 6/2012 | Oikawa ................. | B23K 11/115 |
| | | | | 428/683 |
| 2013/0048155 | A1 * | 2/2013 | Kaneko ................. | B32B 15/013 |
| | | | | 148/533 |
| 2013/0168371 | A1 * | 7/2013 | Furusako ............... | B23K 26/22 |
| | | | | 219/121.64 |
| 2014/0124485 | A1 * | 5/2014 | Tseng .................... | B23K 11/002 |
| | | | | 219/117.1 |
| 2014/0308070 | A1 * | 10/2014 | Taniguchi ............... | B23K 11/11 |
| | | | | 403/271 |
| 2015/0104243 | A1 * | 4/2015 | Watanabe ............... | B23K 11/11 |
| | | | | 403/271 |
| 2016/0075109 | A1 * | 3/2016 | Oka ....................... | B32B 15/013 |
| | | | | 428/659 |
| 2016/0082543 | A1 * | 3/2016 | Wakabayashi ........ | B23K 11/115 |
| | | | | 219/86.31 |
| 2016/0193641 | A1 * | 7/2016 | Hamatani ............... | B21C 37/08 |
| | | | | 148/505 |

FOREIGN PATENT DOCUMENTS

| | | | |
|---|---|---|---|
| EP | 2 783 782 A1 | 10/2014 | |
| JP | 2002-103048 A | 4/2002 | |
| JP | 2003-103377 A | 4/2003 | |
| JP | 2007-130685 A | 5/2007 | |
| JP | 2009-125801 A | 6/2009 | |
| JP | 2010-59451 A | 3/2010 | |
| JP | 2010-115706 A | 5/2010 | |
| JP | WO 2011025015 A1 * | 3/2011 | ........... B23K 11/115 |
| JP | 2013-111584 A | 6/2013 | |
| WO | WO 2011/025015 A1 | 3/2011 | |
| WO | WO-2011025015 A1 * | 3/2011 | ........... B23K 11/115 |

OTHER PUBLICATIONS

Chinese Office Action and Search Report, dated Dec. 21, 2015, for counterpart Chinese Application No. 201380021328.5, with an English translation of the Search Report.
International Search Report, dated Jul. 16, 2013, issued in PCT/JP2013/062198.
Written Opinion of the International Searching Authority, dated Jul. 16, 2013, issued in PCT/JP2013/062198.

\* cited by examiner

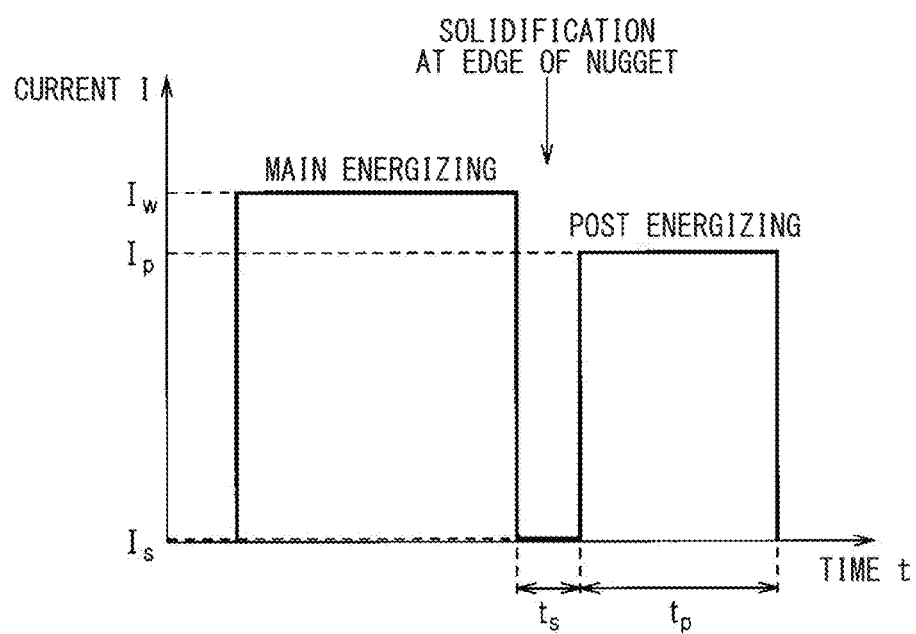

SPOT WELDED JOINT

TECHNICAL FIELD OF THE INVENTION

The present invention relates to a spot welded joint formed by overlapping steel sheets which is used in a vehicle field and the like and which has a tensile strength of 750 MPa to 2500 MPa.

Priority is claimed on Japanese Patent Application No. 2012-100324, filed on Apr. 25, 2012, the content of which is incorporated herein by reference.

RELATED ART

Recently, in a vehicle field, a reduction in weight of a vehicle body for reduction of fuel consumption and $CO_2$ emissions, or high rigidity of the vehicle body for improvement in collision safety has been in demand. To satisfy the demand, it is effective to use a high-strength steel sheet in the vehicle body or components. However, spot welding is mainly used for assembly of the vehicle body, attaching of the components, and the like. Strength in a joint portion is always problematic in the spot welding of the steel sheet (high-strength steel sheet) having a high tensile strength.

In a joint (also, referred to as a "spot welded joint") that is formed by overlapping steel sheets and performing spot welding, a tensile strength and a fatigue strength are important characteristics. Particularly, a tensile shear strength (TSS) that is obtained by performing measurement by applying a tensile load in a shear direction, and a cross tension strength (CTS) that is obtained by a cross tensile test in which measurement is performed by applying a tensile load in a peeling direction are important in the spot welded joint. In addition, methods of measuring the TSS and the CTS are defined in JIS Z 3136 and JIS Z 3137, respectively.

In a steel sheet in which the tensile strength is equal to or higher than 270 MPa and lower than 750 MPa, the CTS of the spot welded joint increases along with an increase in the tensile strength of the steel sheet, and thus a problem related to the strength of the spot welded joint is less likely to occur. However, in a steel sheet in which the tensile strength exceeds 750 MPa, even when the tensile strength of the steel sheet increases, the CTS does not increase or a value of the CTS conversely decreases, and thus the strength of the spot welded joint may be deficient in some cases.

In general, in a case of a high-strength steel sheet, a degree of stress concentration on a nugget increases due to a decrease in deformability of the steel sheet, and in addition to this, toughness of a nugget decreases by quench hardening, and thus the CTS tends to decrease. Therefore, improvement of the CTS has been demanded in the spot welded joint of the high-strength steel sheet having a tensile strength of 750 MPa or higher.

With regard to the spot welded joint of the high-strength steel sheet, as a method of securing the strength and the toughness, a two-step energizing method in which heating energizing is performed after main energizing may be exemplified. For example, Patent Document 1 discloses a method in which tempering energizing is performed after the passage of a predetermined amount of time from completion of the main energizing, and a nugget portion and a heat-affected zone of the spot welded joint are annealed to decrease hardness of the spot welded joint. In addition, Patent Document 2 discloses a method in which after forming a nugget by main energizing, post heating energizing is performed with a current value that is equal to or higher than a main energizing current value. In a spot welded joint that is formed based on the above-described methods, satisfactory characteristics are shown in comparison to a spot welded joint formed by single step energizing in which energizing is not performed after main energizing.

However, these methods have a problem in which productivity is deteriorated by lengthening a post heating energizing time, a problem in which peeling fracture tends to occur inside the nugget due to softening of the nugget, and a problem in which a stable high joint strength is not obtained.

In addition, as a method of securing the strength and the toughness in the spot welded joint of the high-strength steel sheet, a method of heating a welded portion after welding by using a different heating unit may be exemplified. For example, Patent Document 3 discloses a method of performing a tempering treatment by heating a welded portion with a high frequency after welding.

However, this method has a problem in which a separate process is necessary after welding, and thus a working sequence becomes complicated, a problem in which a special apparatus is necessary to use the high frequency, and a problem in which peeling fracture tends to occur inside the nugget due to softening of the welded portion which is caused by a tempering treatment.

Patent Document 4 discloses a method of increasing strength in a peeling direction of the spot welded joint in a case of spot welding a steel sheet having a tensile strength of 440 MPa or higher. In the method, with regard to a component composition of the steel sheet, C×P is defined as 0.0025 or less, P is defined as 0.015% or less, and S is defined as 0.01% or less. In addition, a heat treatment is performed with respect to a welded portion after welding at 300° C. for 20 minutes. However, this method has problems in that an applicable steel sheet is limited, and a long time is necessary for welding, and thus productivity is low.

Patent Document 5 discloses a spot welded joint obtained by using a high-strength steel sheet (a tensile strength: 750 MPa to 1850 MPa, and a carbon equivalent Ceq: 0.22% by mass to 0.55% by mass) in which a microstructure in an outer layer region of a nugget, and an average particle size and a number density of carbides in the microstructure are defined. However, a joint strength is largely affected by a segregation state of impurities (brittle elements) in the joint, and thus it is difficult to obtain a highly reliable joint strength only with a definition of the microstructure.

PRIOR ART DOCUMENT

Patent Document

[Patent Document 1] Japanese Unexamined Patent Application, First Publication No. 2002-103048

[Patent Document 2] Japanese Unexamined Patent Application, First Publication No. 2010-115706

[Patent Document 3] Japanese Unexamined Patent Application, First Publication No. 2009-125801

[Patent Document 4] Japanese Unexamined Patent Application, First Publication No. 2010-059451

[Patent Document 5] PCT International Publication No. WO2011/025015

DISCLOSURE OF THE INVENTION

Problems to be Solved by the Invention

Accordingly, an object of the invention is to stably secure a sufficiently high joint strength, particularly, CTS in spot welding of a steel sheet having a tensile strength of 750 MPa to 2500 MPa in which deficiency of toughness tends to occur and it is difficult to secure a sufficient CTS, and to provide a highly reliable spot welded joint in which the CTS is stably secured.

Means for Solving the Problem

The present inventors have made a thorough investigation on a metallurgical reason why a highly reliable spot welded joint having a sufficiently high CTS is not obtained only with the definition relating to a microstructure in the spot welded joint disclosed in Patent Document 5. As a result, it was proved that continuous segregation of a brittle element such as phosphorous (P) and sulfur (S) in a nugget formed by spot welding has an adverse effect on mechanical characteristics of the spot welded joint, and the segregation of the brittle element, which has an adverse effect on the mechanical characteristics of the spot welded joint, is not mitigated only with the definition of the microstructure.

It is difficult to avoid segregation during solidification of the brittle element in the spot welding, and thus the present inventors have made a thorough investigation to resolve the segregation of the brittle element through a heat treatment in a cooling process during welding. As a result, they have obtained the following findings. Specifically, when an edge of the nugget is solidified once after energizing of the spot welding, and then the nugget is heated by allowing a current to flow through the nugget under necessary conditions, it is possible to mitigate segregation of the brittle element at the edge of the nugget, and thus the CTS of the spot welded joint is improved.

The invention has been made in consideration of the above-described findings, and the gist of the invention is as follows.

(1) A spot welded joint according to an aspect of the present invention is a spot welded joint formed by overlapping a plurality of steel sheets, wherein with respect to a rectangular planar region of 100 μm×100 μm, which is perpendicular to a sheet surface of the plurality of the steel sheets and which centers around an inner point spaced away by 100 μm in a direction parallel with the sheet surface from an edge of a nugget along the direction parallel with the sheet surface, the nugget being formed in an overlapped face of the plurality of the steel sheets, in a case of measuring a P concentration in terms of % by mass along the direction parallel with the sheet surface and a direction perpendicular to the sheet surface at a pitch of 1 μm to obtain measured values of the P concentration at 100×100 of measurement points, and in a case of repetitively calculating an average value of the measured values of the P concentration at 20 of the measurement points which are adjacent to each other and which are arranged in a row in the direction parallel with the sheet surface among the 100×100 of the measurement points while shifting each one point along the direction parallel with the sheet surface and the direction perpendicular to the sheet surface to obtain 81×100 of the average values, the number of the average values, which are more than two times an average value of all of the measured values of the P concentration at the 100×100 of the measurement points, among the average values is 0 to 100.

(2) In the spot welded joint according to (1), a tensile strength of the plurality of the steel sheets may be 750 MPa to 2500 MPa.

(3) In the spot welded joint according to (1) or (2), when an average sheet thickness in terms of mm of the plurality of steel sheets which are overlapped is set as h, a diameter of the nugget in terms of mm may be $3 \times h^{1/2}$ to $7 \times h^{1/2}$.

Effects of the Invention

According to the invention, it is possible to provide a highly reliable spot welded joint due to a high CTS.

BRIEF DESCRIPTION OF THE DRAWINGS

FIG. 3 is a view illustrating an example of an energizing pattern in spot welding.

EMBODIMENTS OF THE INVENTION

In a spot welded joint formed by overlapping steel sheets according to an embodiment, with respect to a rectangular planar region of 100 μm×100 which is perpendicular to a sheet surface of the steel sheets and which centers around an inner point spaced away by 100 μm in a direction parallel with the sheet surface from an edge of a nugget, the nugget being formed in the steel sheets, in a case of measuring a P concentration in terms of % by mass along a direction parallel with the sheet surface and a sheet thickness direction at a pitch of 1 μm to obtain measured values of the P concentration at 100×100 of measurement points, and in a case of repetitively calculating an average value of the measured values at 20 of the measurement points which are adjacent to each other and which are arranged in a row in the direction parallel with the overlapped sheet surface among the 100×100 of the measurement points while shifting each one point along the direction parallel with the sheet surface and the sheet thickness direction to obtain 81×100 of the average values of the measured values at 20 of the measurement points which are adjacent to each other, the number of the average values, which are more than two times an average P concentration in the nugget among the average values is 0 to 100. The spot welded joint according to this embodiment has a sufficiently high joint strength, particularly, a sufficiently high CTS.

Hereinafter, this embodiment will be described with reference to the attached drawings.

Figure 1A:
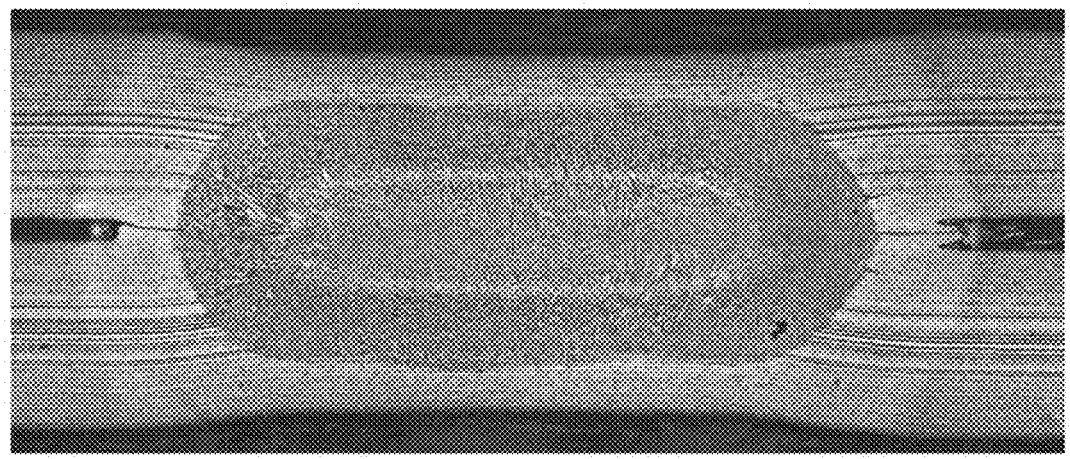
FIG. 1A is a view illustrating a metallographic structure of a cross-section of a nugget in which a metal flow on the cross-section of the nugget which is perpendicular to an overlapped face of a spot welded joint having a high CTS according to the invention is caused to appear by using an aqueous picric acid solution.

The present inventors performed spot welding of steel sheets with variously changing energizing conditions to prepare various spot welded joints. In addition, a nugget of each of the spot welded joints was cut in a direction perpendicular to an overlapped face of a steel sheet, and a cross-section of a nugget was corroded with an aqueous picric acid solution to observe a metallographic structure of the cross-section of the nugget. As a result, the present inventors obtained the following findings. In a case of performing the spot welding according to an energizing pattern shown in FIG. 3, a spot welded joint as shown in FIG. 1A in which a metallographic structure in the central portion of a nugget and a metallographic structure in an edge of the nugget are different from each other is obtained in many cases. The spot welded joint frequently has the above-described P concentration distribution. In addition, the spot welded joint having the above-described P concentration distribution has the high CTS.

Details of the energizing pattern shown in FIG. 3 are as follows. First, main energizing (primary energizing) is performed with a current value $I_w$ for an energizing time $t_w$ while applying a welding pressure to steel sheets. Next, energizing is performed with a current value $I_s$ lower than the current value $I_w$ for an energizing time $t_s$ to solidify an edge of the nugget. Continuously, post energizing (secondary energizing) is performed with a current value $I_p$ for an energizing time $t_p$. In the post energizing, the solidified edge of the nugget is heated or retained at a high temperature. The welding pressure applied to steel sheets is released at a point of time after the passage of a predetermined amount of time from completion of the post energizing.

Typical single step energizing includes a process of melting the steel sheets through welding energizing to form a nugget. However, the typical single step energizing does not include a process of solidifying the nugget after welding energizing, and a process of heating the nugget through post energizing, and thus a metallographic structure of the nugget wholly becomes an as-solidified microstructure. In contrast, when energizing is performed with the current value $I_s$ lower than the current value $I_w$ to solidify the edge of the nugget once, and then appropriate post energizing is performed, it is considered that a metallographic structure of the edge of the nugget is modified by heat during the post energizing, and thus toughness is improved.

Figure 1B:
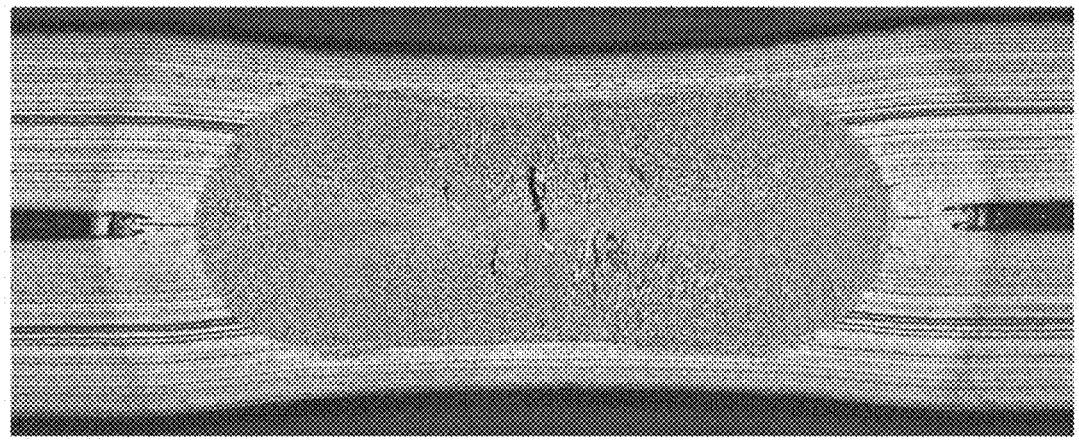
FIG. 1B is a view illustrating a metallographic structure of a cross-section of a nugget in which a metal flow on the cross-section of the nugget which is perpendicular to an overlapped face of a single step welded joint formed by a typical manufacturing method is caused to appear by using the aqueous picric acid solution.

FIGS. 1A and 1B illustrate a corroded structure of a cross-section of a nugget which is perpendicular to an overlapped face of the spot welded joint. FIG. 1A illustrates a cross-section of a spot welded joint which has a high CTS and is spot-welded by the energizing pattern shown in FIG. 3, and FIG. 1B illustrates a macrostructure of a cross-section of a single step welded joint which has a standard CTS obtained by a typical single step welded joint.

According to investigation on a corroded structure of the cross-section of the nugget, it is confirmed that in the spot welded joint shown in FIG. 1A in which the CTS is improved, a structure of the central portion of the nugget and a structure of an edge of the nugget are apparently different from each other. The structure of the edge of the nugget is considered as a modified structure which is solidified after the main energizing with the current value $I_s$ for the energizing time $t_s$, and is heated or retained at a high temperature by the post energizing with the current value $I_p$ for the energizing time $t_p$. The structure of the central portion of the nugget is considered a non-modified structure which is not solidified with the current value $I_s$ for the energizing time $t_s$ after the main energizing, and is retained in an as-solidified state after being melted at the time of completion of the post energizing. Here, the reason for the solidification only at the edge of the nugget is that heat of the edge of the nugget mainly migrates to the outside of the nugget for the energizing time $t_s$. Heat at the central portion of the nugget does not sufficiently migrate to the outside for the energizing time $t_s$ and thus the central portion of the nugget is not solidified for the energizing time $t_s$.

In the single step welded joint, as shown in FIG. 1B, a difference between a structure of the central portion of the nugget and a structure of an edge of the nugget is not found. This is considered to be because the energizing with the current value $I_s$ that is lower than the current value $I_w$ for the energizing time $t_s$, and the post energizing with the current value $I_p$ for the energizing time $t_p$ are not performed, and thus all regions become an as-solidified metallographic structure.

With regard to the spot welded joint in which the CTS is high, a microstructural change of the edge of the nugget, which is confirmed by causing a metal flow to appear, is considered to reflect a variation in a solidifying segregation state of a brittle element.

Accordingly, the present inventors have analyzed a concentration of a segregated element by using an FE-EPMA (refer to "development of a wavelength dispersion type submicron EPMA equipped with a field emission electron gun", Materia Japana, The Japan Institute of Metals and Materials, February 2007, Vol. 46, No. 2, pages 90 to 92) which is capable of performing accurate quantitative analysis in a submicron region.

Figure 2A:
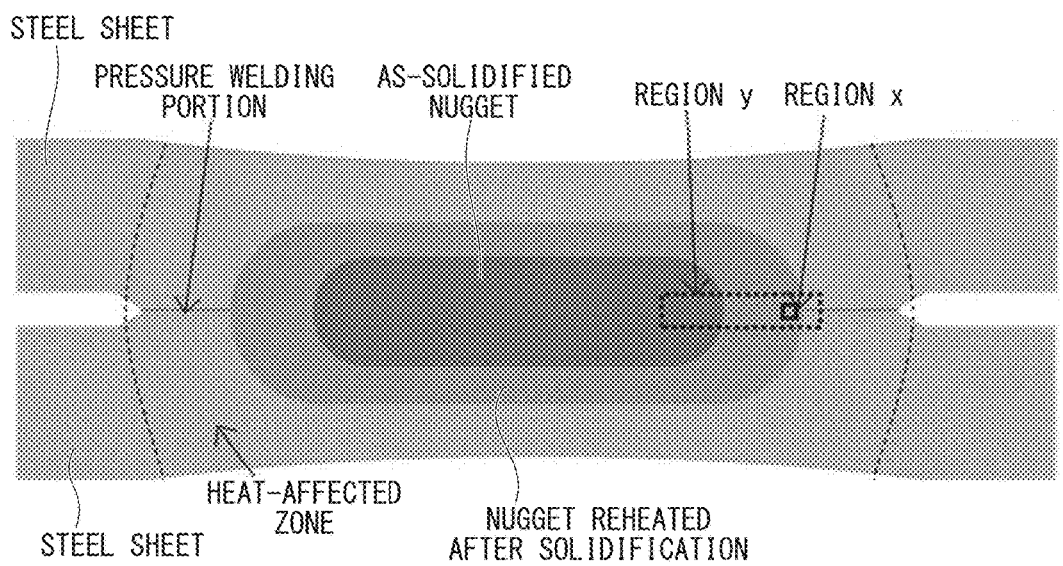
FIG. 2A is a view schematically illustrating the metallographic structure of the cross-section of the nugget which is shown in FIG. 1A.
Figure 2B:
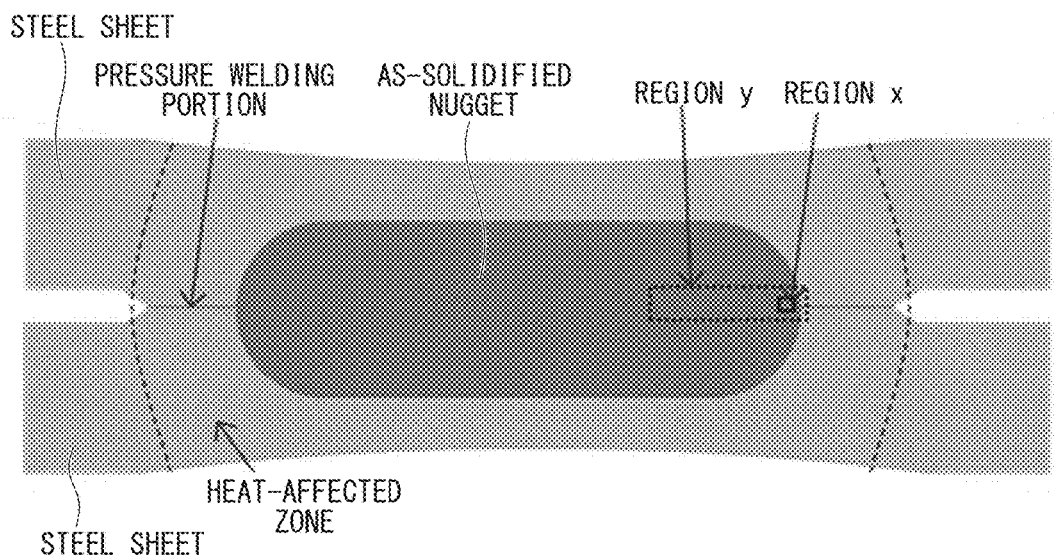
FIG. 2B is a view schematically illustrating the metallographic structure of the cross-section of the nugget which is shown in FIG. 1B.

In FIGS. 2A and 2B, a P concentration (% by mass) in a region y (region including an inner region of the nugget, a white region, an edge of the nugget, and a heat-affected zone) including an edge of the nugget is analyzed with an FE-EPMA under the following conditions with which solidifying segregation can be easily detected.

Acceleration voltage: 15 kV
Beam current: 0.5 µA
Beam staying time per one pixel: 60 ms
Number of pixels: 250×250
Visual field: 1 µm×1 µm In addition, to measure the P concentration with higher accuracy, a plurality of points at the inside of the 1 µm×1 µm region may be measured with a narrower electron beam diameter, and the resultant measured values may be averaged.

It is known that among segregated elements, P and S have an adverse effect on mechanical characteristics of the spot welded joint, but in this embodiment, segregation of P is analyzed. The reason is that in general, in a high-strength steel sheet field, a steel sheet in which an amount of P is larger than that of S is in widespread use. However, in a material in which the amount of S is larger than that of P, similarly, it is possible to evaluate a modified state of a metallographic structure of the nugget by evaluating S instead of P.

Figure 4A:
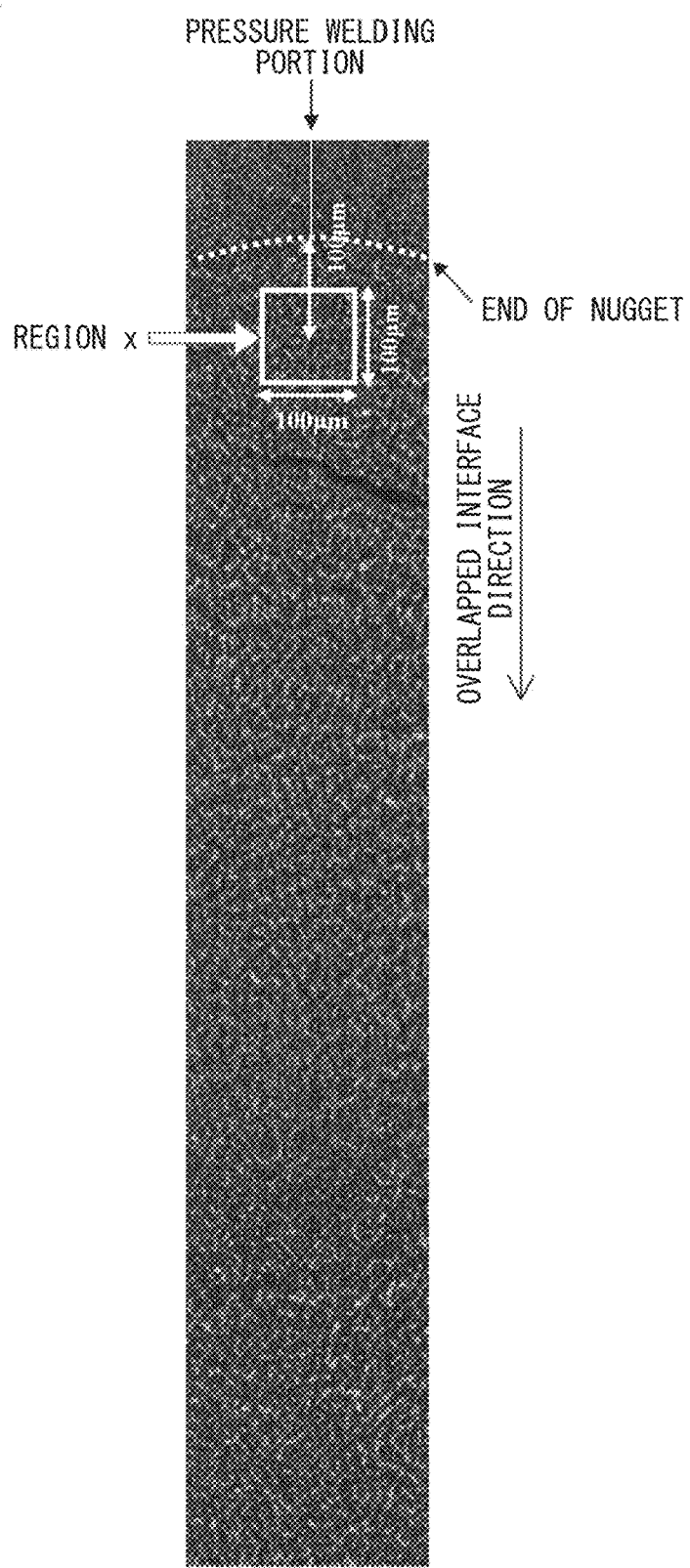
FIG. 4A is a view illustrating six results which are obtained by analyzing a P concentration (% by mass) in a region y shown in FIG. 2A at a visual field of 250 μm×250 μm using an FE-EPMA and which are arranged in a direction (overlapped interface direction) parallel with a sheet surface of a steel sheet.
Figure 4B:
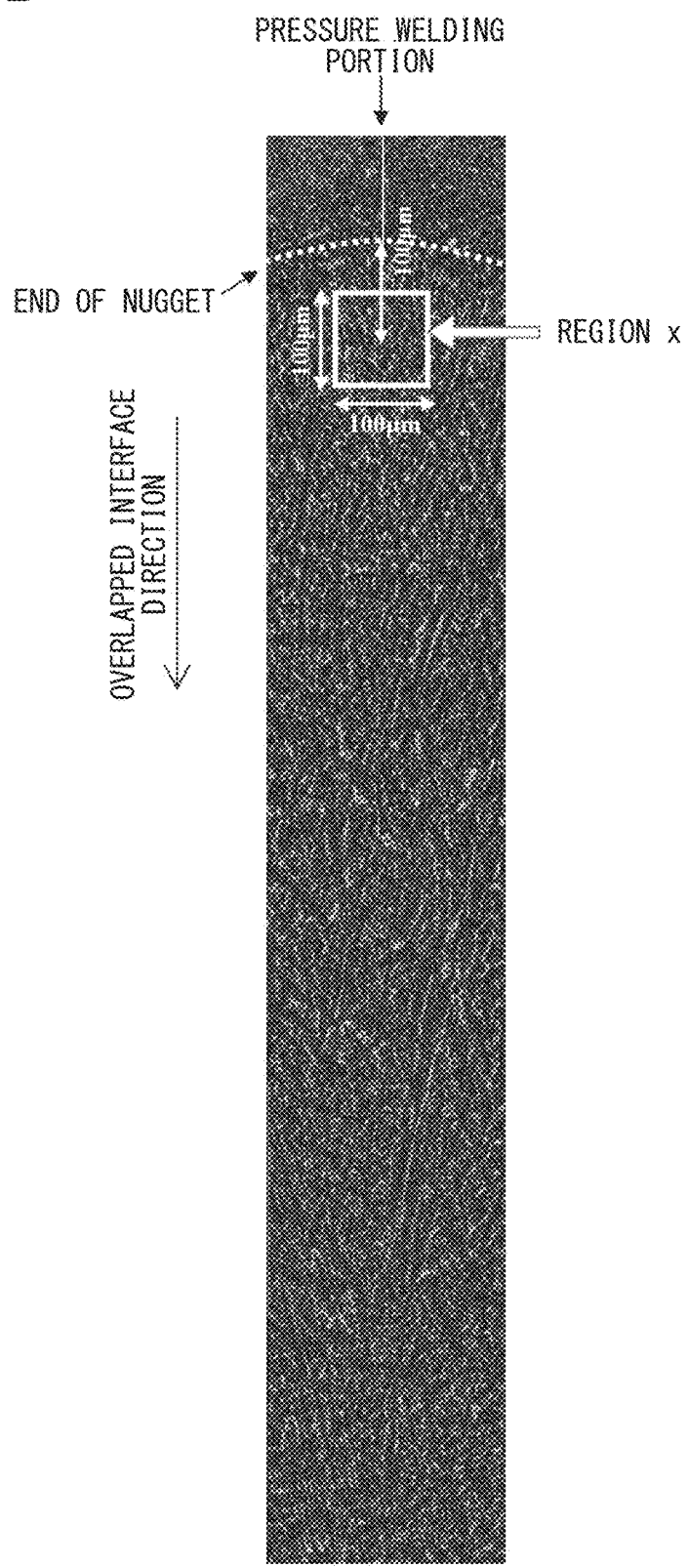
FIG. 4B is a view illustrating six results which are obtained by analyzing the P concentration (% by mass) in a region y shown in FIG. 2B at a visual field of 250 μm×250 μm using the FE-EPMA and which are arranged in a direction (overlapped interface direction) parallel with a sheet surface of a steel sheet.

FIGS. 4A and 4B illustrate a P concentration (% by mass) distribution in the region y shown in FIGS. 2A and 2B. In FIGS. 4A and 4B, six images of results obtained by analyzing the P concentration distribution at a visual field of 250 µm×250 are arranged in parallel with each other. Here, a portion in which the P concentration is high is indicated with white color. FIG. 4A illustrates an analysis result of the spot welded joint which is obtained by the energizing pattern shown in FIG. 3 and in which the CTS is high, and FIG. 4B illustrates an analysis result of the spot welded joint (single step welded joint) obtained by single step welding. As shown in FIG. 4A, in the spot welded joint according to this embodiment, a site in which a high P-concentration region extends along a direction parallel with the sheet surface is not confirmed at an edge of the nugget. In the single step welded joint shown in FIG. 4B, many sites in which the high P-concentration region extends along a direction parallel with the sheet surface are confirmed at an edge of the nugget.

As described above, at the edge of the nugget of the typical spot welded joint, linear P solidifying segregation having a length of several tens of micrometers or longer is confirmed along a direction parallel with the sheet surface. It is considered that the linear solidifying segregation decreases crack extension resistance from an interface of steel sheets. To improve the CTS of the spot welded joint, it is necessary for the P solidifying segregation not to be continuous along a direction parallel with the sheet surface.

When evaluating a segregation state of P at the edge of the nugget by the present inventors, with respect to a rectangular planar region of 100 µm×100 which is perpendicular to the sheet surface and which centers around an inner point spaced away from the edge of the nugget by 100 µm in a direction parallel with the sheet surface in the analysis results shown in FIGS. 4A and 4B, the P concentration in terms of % by mass is measured along the direction parallel with the sheet surface and the sheet thickness direction at a pitch of 1 µm to obtain measured values of the P concentration at 100×100 measurement points. In addition, an average value of the measured values of the P concentration at 20 of the measurement points which are adjacent to each other and which are arranged in a row in the direction parallel with the overlapped sheet surface, among the 100× 100 of the measurement points is repetitively calculated while shifting each one point along the direction parallel with the sheet surface and the sheet thickness direction to calculate 81×100 of the average values of the measured values at 20 adjacent measurement points. The average values are compared with a value that is two times an average P concentration of the above-described rectangular planar region. An average P concentration value of the rectangular planar region is set as an average value of the measured values of the P concentration at the 100×100 of the measurement points.

The reason for evaluating only the rectangular planar region of 100 µm×100 which is perpendicular to the sheet surface and which centers around the inner point spaced away from the edge of the nugget by 100 µm in a direction parallel with the sheet surface is as follows. In a cross tensile test for measuring the CTS, the edge of the nugget and a stable crack growing region present at the periphery of the edge bear a load, and thus modification of a broad region including the edge of the nugget and the periphery of the edge is effective to improve the CTS. In the spot welded joint according to this embodiment, modification is performed across the broad region. However, the width of the stable crack growing region is different depending on the sheet thickness or the kind of steel, and a flat solidification structure may occur at the outermost edge of the nugget. Here, the flat solidification structure represents a structure that is formed by solidification of a molten metal without an occurrence of dendritic growth at a solid-liquid interface. Accordingly, the region to which a peeling load concentrates and which is considered as a dendrite solidification region is preferable for evaluation of modification in the stable crack growing region regardless of the kinds of steel or the sheet thickness.

Figure 5:
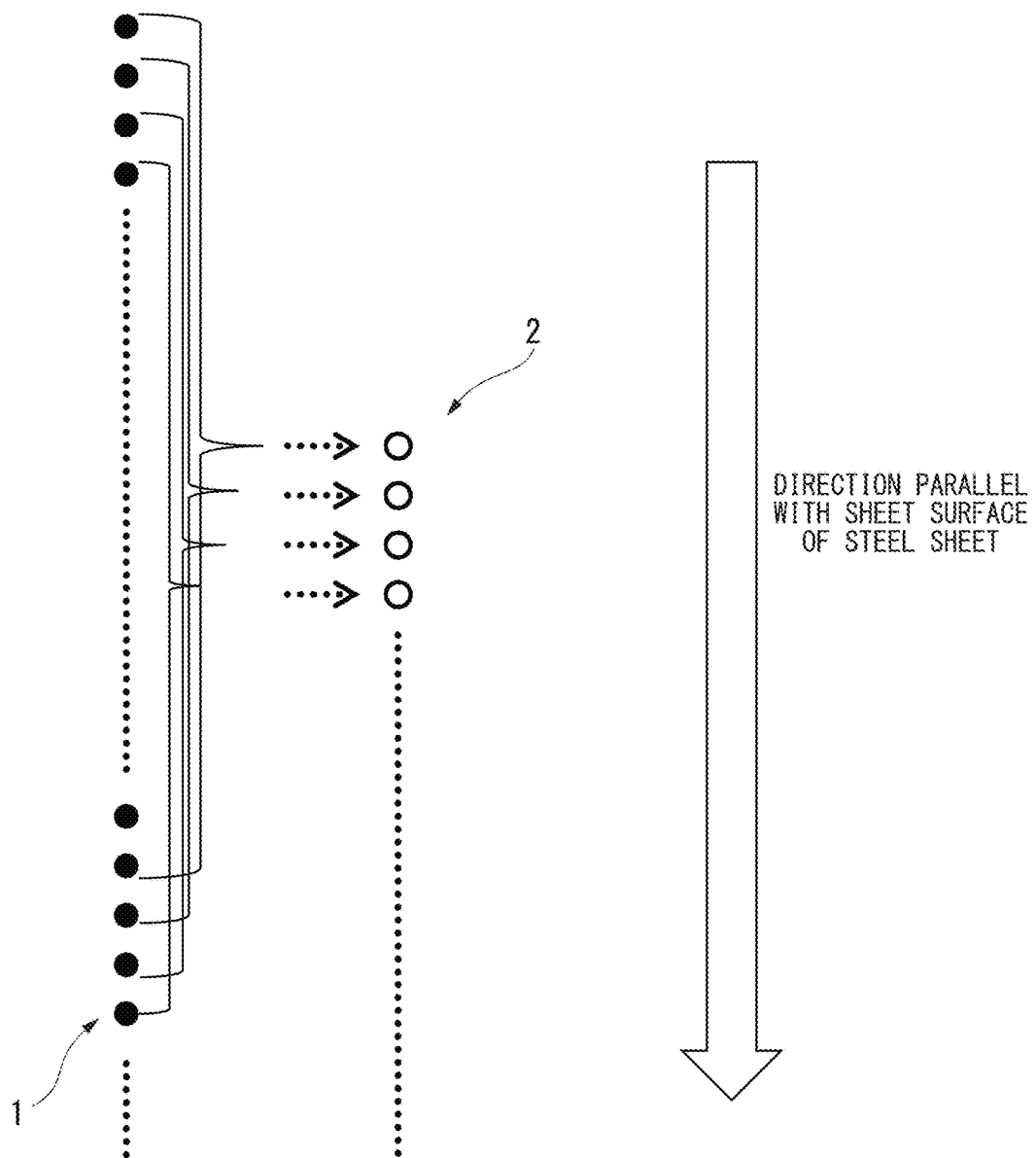
FIG. 5 is a view illustrating a method of obtaining an average value of the P concentration.
Figure 6:
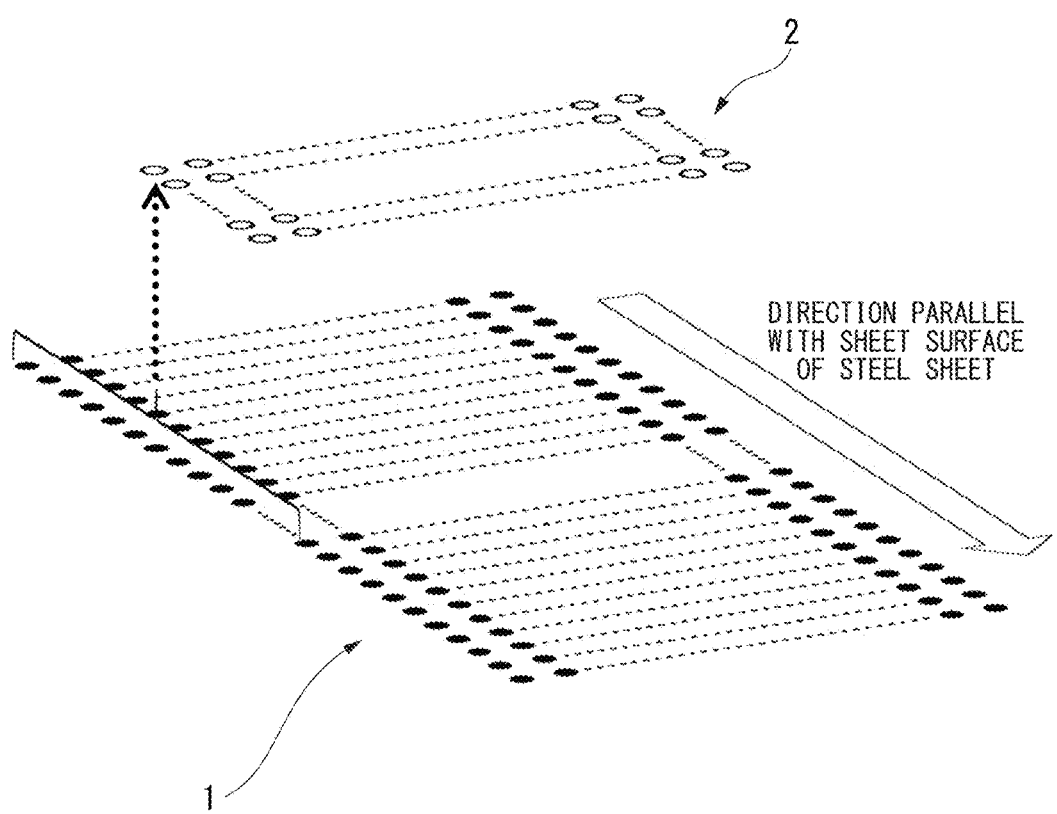
FIG. 6 is a view illustrating a method of obtaining the average value of the P concentration.

To illustrate continuity of segregation in a direction parallel with the sheet surface, as shown in FIGS. 5 and 6, it is necessary to obtain an average of the P concentration at measurement points arranged in a row in a direction parallel with the sheet surface. In a case where dot-shaped segregation is present, a measurement point in which the P concentration is high is confirmed during concentration measurement, but an average value of the P concentration at a plurality of measurement points arranged in a row in a direction parallel with the sheet surface is low. In a case where linear segregation along a direction parallel with the sheet surface is present, the average value of the P concentration at the plurality of measurement points arranged in a row in a direction parallel with the sheet surface is high. Accordingly, it is possible to detect only the linear segregation that has an effect on the CTS by obtaining an average value of the P concentration at the measurement points that are arranged in a row in a direction parallel with the sheet surface.

Here, in a case where a length of a section for obtaining the average is too short, the linear segregation and the dot-shaped segregation are apt to be counted as the same one, and thus it is difficult to detect only the linear segregation. In a case where the length of the section for obtaining the average is too long, it is difficult to sufficiently detect the linear segregation having a length which is shorter than the section length and which may have an effect on the CTS. In general, when the length of the linear segregation exceeds 20 µm, the CTS is affected, and thus it is preferable that the length for obtaining the average be 20 µm.

In addition, the reason for setting a comparison target of the average value of the P concentration to a value that is two times the average P concentration in the provided nugget is that even in a base metal in which segregation is not present, a variation of approximately ±50% is present in the P concentration in accordance with a location. In order for an increase in the average value of the P concentration to be determined as an increase in concentration due to segregation during solidification, it is necessary to set the comparison target of the average value of the P concentration to a value that is two times the average P concentration in the nugget.

Among 8100 average values of the 20 measurement points which are adjacent to each other, which are arranged in a row in a direction parallel with the sheet surface, and which are obtained in this manner, when the number of the average values, which are more than two times the average value of all of the measured values of the P concentration in the 100×100 of the measurement points is 100 or less, it is found that the CTS is very high. In this case, segregation of P is mitigated in the x region of FIG. 2A, and thus it is considered that toughness is satisfactorily maintained in the vicinity of an intersection, which becomes a starting point of a fracture, between a pressure welding portion (corona bond) of steel sheets and the nugget, and an inner region thereof.

It is considered that performing the post energizing after the main energizing may improve the segregation in the edge region of the nugget due to the following reasons.

When lowering a current, the nugget that is formed by the main energizing starts to be solidified from the edge of the nugget. At this time, a brittle element such as P segregates to a boundary of a dendrite during solidification of the nugget. In the case of single step energizing spot welding, or in a case where two step energizing is performed without any time to solidify the nugget between the main energizing and the post energizing, the segregated brittle element remains in a final structure, and thus the segregated brittle element becomes a cause of embrittlement of the nugget.

In this embodiment, a structure of the nugget and a structure at the periphery of the nugget are heated by the post energizing after passage of the energizing time $t_s$ from completion of the main energizing. At this time, depending on the condition of the post energizing, linearly segregated P is homogenized due to diffusion. Alternatively, at this time, depending on the condition of the post energizing, the concentration of the linearly segregated P decreases or the linearly segregated P is segmentated due to re-segregation into a grain boundary of fine crystal grains that are generated by reverse transformation.

In a case where temperature rise due to the post energizing is low, or in a case where the heating time due to the post energizing is short, the diffusion of the segregated P or re-segregation of the segregated P into a grain boundary of the fine crystal grains does not sufficiently occur. In addition, in a case where temperature rise due to the post energizing is high, or in a case where the heating time due to the post energizing is long, a volume of a melted portion at the center of the nugget increases, and thus the edge of the solidified nugget is re-melted. Therefore, the edge of the nugget has a typically as-solidified structure after completion of the post energizing, and thus solidifying segregation remains.

A diameter of the nugget of the spot welded joint according to this embodiment is in a range of $3 \times h^{1/2}$ mm to $7 \times h^{1/2}$ mm with respect to an average sheet thickness h of steel sheets that are subjected to spot welding in consideration of strength that is necessary in practical use in the spot welded joint of a steel sheet having a tensile strength of 750 MPa to 2500 MPa. When the diameter of the nugget exceeds a diameter of an electrode front end, expulsion tends to occur during spot welding, and thus it is preferable that the diameter of the nugget be set to be equal to or less than the diameter of the electrode front end.

(Tensile Strength of Steel Sheet)

Generally, the further a tensile strength of the steel sheet increases, the further a load operating on the spot welded joint increases, and the further stress concentration to a welded portion increases. Accordingly, it is necessary for the spot welded joint to have a high joint strength.

Typically, if the tensile strength of the steel sheet exceeds 750 MPa, even when the tensile strength of the steel sheet further increases, the CTS does not increase or, in contrast, a value of the CTS decreases. However, in the spot welded joint according to this embodiment, segregation of P is mitigated, and thus even in a case of being formed from a steel sheet having a tensile strength of 750 MPa or higher, it is possible to maintain a satisfactory CTS.

The upper limit of the tensile strength of the steel sheet is not particularly defined. However, in a case where the tensile strength is high, (i) it is difficult to suppress a decrease or a deviation in the strength of the spot welded joint, or (ii) it is difficult to suppress a defect or a crack inside the nugget. Accordingly, it is preferable that the tensile strength of the steel sheet be 2500 MPa or lower.

Accordingly, the spot welded joint according to this embodiment is preferable for spot welding of a steel sheet having a tensile strength of 750 MPa to 2500 MPa.

(Component Composition of Steel Sheet)

A component composition of a steel sheet that is a target in the spot welded joint according to this embodiment is not particularly limited. As a steel sheet material, a cold-rolled material or a hot-rolled material such as a known hot stamp material and a super-high tension material may be used. However, specifically, a steel sheet having the following component composition is preferable.

For example, a steel sheet which has a basic composition including, in terms of % by mass, C: 0.08% to 0.40%, Si: 0.01% to 2.50%, Mn: 0.8% to 3.0%, P: 0.05% or less, S: 0.01% or less, N: 0.01% or less, O: 0.007% or less, and Al: 1.00% or less, the remainder being Fe and unavoidable impurities, and further including an element selected from the following groups (a) to (c) as necessary is preferable to manufacture the spot welded joint according to this embodiment.

(a) One or more kinds of elements selected from the group consisting of Ti: 0.005% to 0.10%, Nb: 0.005% to 0.10%, and V: 0.005% to 0.10%

(b) One or more kinds of elements selected from the group consisting of B: 0.0001% to 0.01%, Cr: 0.01% to 2.0%, Ni: 0.01% to 2.0%, Cu: 0.01% to 2.0%, and Mo: 0.01% to 0.8%

(c) One or more kinds of elements selected from Ca, Ce, Mg, and REM in a total amount of 0.0001% to 0.5%

In addition, particularly, P and S segregate in a dendrite to decrease the CTS, and thus when it is desirable to obtain a high CTS, it is preferable that the amount of the elements be made to be relatively small.

Hereinafter, the reason for limiting the component composition will be described. In addition, % represents % by mass.

C: 0.08% to 0.40%

C is an element that increases a tensile strength of steel. When an amount of C is large, an amount of C in the nugget is also large, and thus a final structure tends to be hard. When the amount of C is less than 0.08%, it may be difficult to obtain a tensile strength of 750 MPa or higher, and hardness of the nugget may be low, and thus the TSS may be apt to be lowered. On the other hand, when the amount of C exceeds 0.40%, workability may deteriorate, and the nugget may be too hard and may be brittle. Accordingly, it is preferable that the amount of C be 0.08% to 0.40%, and more preferably 0.10% to 0.31%.

Si: 0.01% to 2.50%

Si is an element that increases the strength of steel through solid-solution strengthening and structure strengthening. When the amount of Si exceeds 2.50%, workability of steel may decrease. On the other hand, it is industrially difficult to reduce the amount of Si to an amount less than 0.01%. Accordingly, it is preferable that the amount of Si be 0.01% to 2.50%, and more preferably 0.05% to 1.20%.

Mn: 0.8% to 3.0%

Mn is an element that increases hardenability of steel. When an amount of Mn exceeds 3.0%, formability of steel may deteriorate. On the other hand, when the amount of Mn is less than 0.8%, it may be difficult to obtain a tensile strength of 750 MPa or higher. Accordingly, it is preferable that the amount of Mn be 0.8% to 3.0%, and more preferably 1.0% to 2.5%.

P: 0.05% or less

P is an element that segregates and makes the spot welded joint brittle. When an amount of P exceeds 0.05%, even when the segregation of P is mitigated, it may be difficult to obtain a sufficient CTS. In addition, the less the amount of P is, the more preferable. However, it is industrially difficult to reduce the amount of P to an amount less than 0.001%, and thus 0.001% is the substantial lower limit of the amount of P. More preferably, the amount of P is 0.03% or less.

S: 0.01% or less

S is an element which segregates to make the spot welded joint brittle, and which forms coarse MnS and deteriorates the workability of steel. When an amount of S exceeds 0.01%, the workability of steel may deteriorate, and cracking may tend to occur inside the nugget, and it may be difficult to obtain a sufficient CTS. In addition, the less the amount of S is, the more preferable. However, when the amount of S is set to be less than 0.0001%, the manufacturing cost increases. Accordingly, 0.0001% is the substantial lower limit of the amount of S. More preferably, the amount of S is 0.006% or less.

N: 0.01% or less

N is an element which forms coarse nitrides and deteriorates formability, and which becomes a cause of generating blow holes during welding. When an amount of N exceeds 0.01%, the deterioration of the formability and the generation of the blow holes may be significant. In addition, the less the amount of N is, the more preferable. However, when the amount of N is set to be less than 0.0005%, the manufacturing cost increases, and thus 0.0005% is the substantial lower limit of the amount of N. More preferably, the amount of N is 0.007% or less.

O: 0.007% or less

O is an element that forms oxides and deteriorates the formability of steel. When the amount of O exceeds 0.007%, the deterioration of the formability may be significant. In addition, the less the amount of O, the more preferable. However, when the amount of O is set to be less than 0.0005%, the manufacturing cost increases. Accordingly, 0.0005% is the substantial lower limit of the amount of O. More preferably, the amount of O is 0.005% or less.

Al: 1.00% or less

Al is a deoxidizing element and is an element that stabilizes ferrite and suppresses precipitation of cementite. When the amount of Al exceeds 1.00%, inclusions may increase, and thus formability may deteriorate. It is not necessary to define the lower limit of the amount of Al. However, excessive reduction in an amount of Al is not practical in consideration of the refining cost, and thus the lower limit of the amount of Al is set to 0.001%.

(a) One or More Kinds of Elements Selected from Group Consisting of Ti: 0.005% to 0.10%, Nb: 0.005% to 0.10%, and V: 0.005% to 0.10%

Ti, Nb, and V are elements that strengthen steel through precipitation strengthening, fine grain strengthening by suppression of growth in ferrite crystal grains, and dislocation strengthening by suppression of recrystallization. When an amount of any element is less than 0.005%, a containing effect is not sufficient. When the amount of any element exceeds 0.10%, the formability of steel may deteriorate. More preferably, the amount of each of Ti, Nb, and V is 0.01% to 0.08%.

(b) One or More Kinds of Elements Selected from Group Consisting of B: 0.0001% to 0.01%, Cr: 0.01% to 2.0%, Ni: 0.01% to 2.0%, Cu: 0.01% to 2.0%, and Mo: 0.01% to 0.8%

B is an element that controls a structure and strengthens steel. When an amount of B is less than 0.0001%, strength may not be sufficiently improved. When the amount of B exceeds 0.01%, a containing effect is saturated. Cr Ni, Cu, and Mo are elements that contribute to the improvement of the strength of steel. When an amount of any element is less than 0.01%, a containing effect may not be sufficient. When the amount of any element exceeds 2.0%, a problem such as the occurrence of cracking may occur during pickling or hot rolling. The amount of 13 is more preferably 0.0003% to 0.08%, the amount of each of Cr, Ni, and Cu is more preferably 0.02% to 1.0%, and the amount of Mo is more preferably 0.015% to 0.6%.

(c) One or More Kinds of Elements Selected from Ca, Ce, Mg, and REM in Total Amount of 0.0001% to 0.5%

Ca, Ce, Mg, and REM are elements which reduce dimensions of oxides after deoxidation and dimensions of sulfides in a hot-rolled steel sheet and which improve formability. When the total amount of these elements is less than 0.0001%, a containing effect may be small. When the total amount of these elements exceeds 0.5%, the formability of steel may deteriorate. In addition, the REM is a lanthanoid-series element, and the REM and Ca are contained in a form of misch metal at a steel making step. More preferably, the total amount of Ca, Ce, Mg, and REM is 0.0002% to 0.3%.

(Method of Manufacturing Spot Welded Joint)

As described above, the spot welded joint according to this embodiment, which has the above-described P concentration distribution, can be obtained by modifying the edge of the nugget of the spot welded joint through the post energizing. Manufacturing conditions, under which the spot welded joint according to this embodiment is formed, basically conform to the energizing pattern shown in FIG. 3.

In a case of performing energizing according to the energizing pattern shown in FIG. 3, the following temperature history is assumed. Specifically, the edge of the nugget is solidified after the main energizing, and then the nugget is reheated or retained at a high temperature in a range in which the solidified edge is not re-melted. It is not necessary to rapidly cool the edge of the nugget during solidification of the edge of the nugget, and thus it is considered that a current value may be lowered in order for a heat input to be sufficiently lowered.

However, when the time taken to solidify the edge of the nugget is lengthened, or when the nugget in a normal state with a lowered current value is large, a solidified region from the edge becomes narrow, and thus a low current value is preferable.

Specifically, the spot welded joint according to this embodiment is obtained in the following sequence. Hereinafter, a unit of the current value is set as kA, and a unit of time is set as msec.

A current value $I_w$ and an energizing time $t_w$ with which, when typical one step energizing spot welding with respect to overlapped steel sheets (average sheet thickness: h [mm]) is performed, a predetermined nugget diameter $\alpha \times h^{1/2}$ [mm] is obtained is experimentally obtained. In general, a nugget shape is approximately circular. However, in a case where the nugget shape is not approximately circular, on the assumption of a circle having the same area as that of the nugget, a diameter of the circle is set as the predetermined nugget diameter $\alpha \times h^{1/2}$ [mm]. Continuously, the spot welded joint is prepared by the following processes.

(Main Energizing Process)

First, the typical welding energizing is performed with the current value $I_w$ for energizing time With regard to a welding pressure during the welding energizing, 1960×h to 3920×h [N] is set as a standard with respect to an average sheet thickness h.

(Solidification Process)

After the common welding energizing, energizing is retained under pressure with a current value $I_s$ satisfying Expression (1) for an energizing time $t_s$ satisfying Expression (2).

$$0 \leq I_s \leq (\tfrac{1}{2})^{1/2} \times I_w \tag{1}$$

$$\alpha^2 \times \{2 \times (I_s^2/I_w^2)+1\} \times h \leq t_s \leq 3 \times \alpha^2 \times \{2 \times (I_s^2/I_w^2)+1\} \times h \tag{2}$$

According to this, the edge of the nugget is solidified by reducing the heat input with respect to a welded portion.

(Post Energizing Process)

After the solidification process, energizing is retained with a current value $I_p$ satisfying Expression (3) for an energizing time $t_p$ satisfying Expression (4) to heat the solidified edge of the nugget or to retain the solidified edge of the nugget at a high temperature.

$$I_p > 0.8 \times I_w \tag{3}$$

$$I_p^2 \times t_p \leq I_w^2 \times t_w \tag{4}$$

The current value $I_p$ to heat the edge of the nugget or to retain the edge of the nugget at a high temperature during the post energizing process is required to be higher than the current value $I_S$ which solidifies the edge of the nugget during the solidification process. In a case of performing energizing with a low current during the post energizing process, heat release to an electrode or a sheet is dominant in comparison to heat generation, and thus heat necessary to diffuse P that is subjected to solidifying segregation to the edge of the nugget is not sufficiently obtained. Therefore, time is taken for diffusion of P, and thus the above-described case is not appropriate in practical use.

In the post energizing process, in a case of performing energizing with a high current for a long time, re-melting occurs, and thus modification of the edge does not occur.

In the post process, one current value and one energizing time are defined, but the post energizing pattern may be complicated as long as re-melting does not occur. In this case, it is preferable to determine the current value in order for an average current value (effective value) in each process to satisfy Expression (3) and Expression (4). In a case of using a complicated current pattern in each of the main energizing process in which a joint portion is melted, the solidification process in which the edge of the nugget is solidified, and the post energizing process in which the edge of the nugget is heated or is retained at a high temperature, it is preferable to determine the current value by using an effective value with respect to the pattern.

Next, in the spot welded joint obtained by the above-described processes, a segregation state of P at the edge of the nugget is evaluated. The evaluation is performed as follows. First, with respect to a rectangular planar region of 100 μm×100 μm, which is perpendicular to the sheet surface and which centers around an inner point spaced away from the edge of the nugget by 100 μm in a direction parallel with the sheet surface, the P concentration in terms of % by mass is measured along a direction parallel with the sheet surface and a direction perpendicular to the sheet surface at a pitch of 1 μm to obtain measured values of the P concentration at 100×100 of the measurement points. In addition, an average value of the measured values of the P concentration at 20 of the measurement points which are adjacent to each other and which are arranged in a row in a direction parallel with the overlapped sheet surface, among the 100×100 of the measurement points is repetitively calculated while shifting each one point along the direction parallel with the sheet surface and the direction perpendicular to the sheet surface to obtain 81×100 of the average values of the measured values at 20 of the adjacent measurement points. It is determined whether or not among the obtained average values, the number of average values that are more than two times an average P concentration (% by mass) in the nugget is 100 or less. When the number of average values that are more than two times the average P concentration (% by mass) in the nugget is 100 or less, it can be determined that the spot welded joint according to this embodiment, in which segregation of P is mitigated, is obtained. When performing the spot welding based on the energizing conditions under which the spot welded joint is obtained, it is possible to obtain the spot welded joint according to this embodiment by using the steel sheet in which the spot welded joint is obtained.

Even when the manufacturing is performed while satisfying the above-described conditions, the segregation of P may not be mitigated. In this case, the following situations may be considered. Specifically, the current value during the post energizing process is deficient, and thus modification of the edge of the nugget is not sufficiently performed. In addition, the current value during the post energizing process is too large, and thus the solidified region of the edge of the nugget is re-melted. As a result, the modification of the edge of the nugget is not performed. In these cases, a metal flow of a cross-section of the nugget is observed, and energizing conditions are changed based on observation results to optimize manufacturing processes.

In a case where the segregation of P is not mitigated, but an apparent difference between a structure of the central portion of the nugget and a structure of the edge of the nugget is confirmed by the observation of the metal flow on the cross-section, it is considered that the modification of the edge of the nugget is performed, but the modification is deficient. As a cause of the deficiency in the modification, a case in which the heat input during the post energizing process is deficient, or a case in which the solidification time between the main energizing process and the post energizing process is too long and thus a temperature of the nugget is lowered may be considered. In each cases, the heat input is deficient in comparison to an amount of heat necessary to raise a temperature of the nugget to a temperature capable of effectively subjecting the nugget to a heat treatment. Accordingly, it becomes close to the conditions under which the segregation is mitigated by increasing $I_p$ or $t_p$ or by decreasing $t_s$. The increasing of $I_p$ or $t_p$ is performed to increase the heat input, and the decreasing of $t_s$ is performed to reduce a solidification region to be thermally treated during the post energizing process, and to input heat in order for the edge of the nugget to enter a relatively high temperature state, thereby easily raising a temperature of the nugget to a temperature at which the heat treatment is effectively performed.

In a case where the segregation of P is not mitigated, and an apparent difference between the structure of the central portion of the nugget and the structure of the edge of the nugget is not confirmed by the observation of the metal flow of the cross-section, it can be considered that the solidified region at the edge of the nugget is re-melted. This is caused by too much heat input during the post energizing process, and thus it becomes close to the conditions under which the segregation is mitigated by decreasing $I_p$ or $t_p$ or by increasing $t_s$. The decreasing of $I_p$ or $t_p$ is performed to decrease the heat input, and the increasing of $t_s$ is performed to increase an amount of heat dissipation to the outside from the nugget before initiation of the post energizing, thereby reducing an effect of the heat input due to the post energizing. When the manufacturing processes are optimized by repeating the change of the energizing conditions and the observation of the metal flow of the cross-section, it is possible to obtain the spot welded joint according to this embodiment. When performing the spot welding based on the energizing conditions under which the spot welded joint is obtained, it is possible to obtain the spot welded joint according to this embodiment by using the steel sheet in which the spot welded joint is obtained.

With regard to optimization of the manufacturing process in a case where even when performing welding based on recommended conditions, the segregation of P is not reduced, it is not necessary to satisfy Expression (1) to Expression (4).

EXAMPLES

Next, examples of the invention will be described. Manufacturing conditions in examples represent a conditional example that is employed to confirm applicability and an effect of the invention, and the invention is not limited to the conditional example. The invention may employ various conditions as long as the object of the invention is accomplished without departing from the gist of the invention.

Example 1

Steel sheets A to D shown in Table 1 were prepared, and the same kind of steel sheets were overlapped. Then, spot welding was performed with respect to the overlapped steel sheets by using a servo gun type welding machine to prepare test specimens of the spot welded joint. At that time, conditions of the main energizing, and time (squeeze time) from pressurizing to energizing and pressuring retention time after post energizing were made to be constant in combinations of different kinds of steel.

In steel sheets A to C, the amount of C was 0.21% by mass, and Ceq was 0.34%. In steel sheet D, the amount of C was 0.19% by mass, and the Ceq was 0.32%. The Ceq represents a carbon equivalent, and is obtained by the following expression.

$$Ceq=[C]+[Si]/30+[Mn]/20+2\times[P]+4\times[S]$$

In Table, a site indicated by "-" represents that energizing is not performed.

[Table 1]

In addition, a preliminary experiment was performed before the spot welding, and on the basis of results of the preliminary experiment, an amount of main energizing during the spot welding was set to a value ($4.5 \times t^{1/2}$ to $5 \times t^{1/2}$) with which a diameter of the nugget became 4.5 to 5 times the square root of the sheet thickness of one steel sheet, and then the welding was performed under conditions in which the post energizing was changed.

In addition, analysis of a cross-section of the nugget and measurement of the cross tension strength (CTS) were performed for each condition. In the combinations of the steel sheets, whether or not the segregation mitigating conditions of the invention were satisfied and results obtained by evaluating the CTS are shown in Table 2.

In addition, a CTS improvement rate shown in Table 2 represents a rate of an amount of increase or decrease in CTS to CTS of spot welded joints (A-6, B-4, C-4, and D-5) in which only the main energizing was performed. In addition, whether or not reduction of segregation was performed was determined as follows. With respect to a rectangular planar region of 100 μm×100 μm, which is perpendicular to the sheet surface and which centers around an inner point spaced away from the edge of the nugget by 100 μm in a direction parallel with the sheet surface, the P concentration in terms of % by mass was measured along the direction parallel with the sheet surface and the sheet thickness direction at a pitch of 1 μm to obtain measured values of the P concentration at 100×100 of the measurement points. In addition, an average value of the measured values of the P concentration at 20 of the measurement points which are adjacent to each other and which are arranged in a row in the direction parallel with the overlapped sheet surface, among the 100×100 of the measurement points is calculated while shifting each one point along the direction parallel with the sheet surface and the sheet thickness direction to calculate 81×100 of the average values of the measured values at 20 of the measurement points which are adjacent to each other. Then, whether or not reduction of segregation was performed was determined on the basis whether or not among the average values, the number of the average values that are more than two times an average value (average P concentration) of all of the measured values of the P concentration in the 100×100 of the measurement points is 0 to 100. In samples in which the number of the average values exceeding the average P concentration was 0 to 100, it was considered that the reduction of segregation was performed, and thus a symbol "G" (Good) was given to these samples. A symbol "B" (Bad) was given to samples in which the number of the average values exceeding the average P concentration was 100 or more.

[Table 2]

As shown in Table 2, in Inventive Examples in which the segregation state of P satisfied the standard of the invention, the CTS value was high even in the same sheet combination and the same nugget diameter, and thus a highly reliable spot welded joint was obtained. On the other hand, samples that did not satisfy the standard of the invention were spot welded joints in which the CTS value was low.

INDUSTRIAL APPLICABILITY

As described above, according to the invention, it is possible to provide a spot welded joint in which a fracture shape is satisfactory and reliability is high. Accordingly, the invention has high industrial applicability.

BRIEF DESCRIPTION OF THE REFERENCE SYMBOLS

1: 100×100 measurement points
2: 81×100 of the average values

TABLE 1

| SYMBOL | KIND OF STEEL | STRENGTH GRADE | SHEET THICKNESS [mm] | Ceq | PLATING | ELECTRODE | WELDING CONDITION |
|---|---|---|---|---|---|---|---|
| A | HS STEEL SHEET | 1470 MPa | 2.0 | 0.34 | Al | Cr—Cu DR-TYPE R40 TIP DIAMETER: ø8 | WELDING PRESSURE: 5 kN RETAINING: 100 msec |
| B | HS STEEL SHEET | 1470 MPa | 1.4 | 0.34 | Al | Cr—Cu DR-TYPE R40 TIP DIAMETER: ø8 | WELDING PRESSURE: 5 kN RETAINING: 100 msec |

TABLE 1-continued

| SYMBOL | KIND OF STEEL | STRENGTH GRADE | SHEET THICKNESS [mm] | Ceq | PLATING | ELECTRODE | WELDING CONDITION |
|---|---|---|---|---|---|---|---|
| C | HS STEEL SHEET | 1470 MPa | 1.2 | 0.34 | Al | Cr—Cu DR-TYPE R40 TIP DIAMETER: ø6 | WELDING PRESSURE: 3 kN RETAINING: 100 msec |
| D | COLD-ROLLED STEEL SHEET | 1180 MPa | 1.6 | 0.32 | NONE | Cr—Cu DR-TYPE R40 TIP DIAMETER: ø6 | WELDING PRESSURE: 3 kN RETAINING: 100 msec |

TABLE 2

| | CONDITION | | | | | | | CONCLUSION | | | | |
|---|---|---|---|---|---|---|---|---|---|---|---|---|
| | $I_w$ [kA] | $t_w$ [msec] | $I_s$ [kA] | $t_s$ [msec] | $I_p$ [kA] | $t_p$ [msec] | | α | CTS [kN] | CTS IMPROVEMENT RATE[%] | REDUCTION OF SEGREGATION | REMARKS |
| A-1 | 8.0 | 320 | 5.5 | 200 | 7.7 | 100 | A-1 | 5.0 | 10.9 | 13 | G | INVENTIVE EXAMPLE |
| A-2 | 8.0 | 320 | 0 | 120 | 7.7 | 160 | A-2 | 5.0 | 12.0 | 25 | G | INVENTIVE EXAMPLE |
| A-3 | 8.0 | 320 | 0 | 120 | 7.9 | 120 | A-3 | 5.0 | 11.7 | 21 | G | INVENTIVE EXAMPLE |
| A-4 | 8.0 | 320 | 0 | 120 | 3.1 | 300 | A-5 | 5.0 | 8.9 | −7 | B | COMPARATIVE EXAMPLE |
| A-5 | 8.0 | 320 | 0 | 120 | 3.1 | 400 | A-6 | 5.0 | 8.7 | −10 | B | COMPARATIVE EXAMPLE |
| A-6 | 8.0 | 320 | — | — | — | — | A-7 | 5.0 | 9.6 | BENCHMARK | B | COMPARATIVE EXAMPLE |
| A-7 | 8.0 | 320 | 0 | 0 | 4 | 100 | A-8 | 5.0 | 9.3 | −4 | B | COMPARATIVE EXAMPLE |
| A-8 | 8.0 | 320 | 0 | 0 | 7.3 | 100 | A-9 | 5.0 | 10.1 | 5 | B | COMPARATIVE EXAMPLE |
| B-1 | 6.5 | 300 | 4 | 160 | 6.2 | 160 | B-1 | 4.9 | 10.1 | 93 | G | INVENTIVE EXAMPLE |
| B-2 | 6.5 | 300 | 0 | 100 | 6.2 | 200 | B-2 | 4.9 | 9.9 | 90 | G | INVENTIVE EXAMPLE |
| B-3 | 6.5 | 300 | 0 | 100 | 6.4 | 60 | B-3 | 4.9 | 7.5 | 44 | G | INVENTIVE EXAMPLE |
| B-4 | 6.5 | 300 | — | — | — | — | B-5 | 4.9 | 5.2 | BENCHMARK | B | COMPARATIVE EXAMPLE |
| C-1 | 5.4 | 220 | 3.3 | 100 | 5.2 | 100 | C-1 | 4.0 | 6.6 | 66 | G | INVENTIVE EXAMPLE |
| C-2 | 5.4 | 220 | 0 | 40 | 5.2 | 100 | C-2 | 4.0 | 7.5 | 91 | G | INVENTIVE EXAMPLE |
| C-3 | 5.4 | 220 | 0 | 60 | 5.3 | 20 | C-4 | 4.0 | 4.1 | 3 | B | COMPARATIVE EXAMPLE |
| C-4 | 5.4 | 220 | — | — | — | — | C-5 | 4.0 | 3.9 | BENCHMARK | B | COMPARATIVE EXAMPLE |
| D-1 | 5.0 | 280 | 3 | 120 | 4.8 | 120 | D-1 | 4.3 | 9.0 | 56 | G | INVENTIVE EXAMPLE |
| D-2 | 5.0 | 280 | 0 | 40 | 4.8 | 120 | D-2 | 4.3 | 9.4 | 63 | G | INVENTIVE EXAMPLE |
| D-3 | 5.0 | 280 | 0 | 60 | 4.9 | 100 | D-3 | 4.3 | 9.9 | 73 | G | INVENTIVE EXAMPLE |
| D-4 | 5.0 | 280 | 0 | 120 | 4.8 | 20 | D-4 | 4.3 | 6.1 | 6 | B | COMPARATIVE EXAMPLE |
| D-5 | 5.0 | 280 | — | — | — | — | D-5 | 4.3 | 5.8 | BENCHMARK | B | COMPARATIVE EXAMPLE |

α = DIAMETER OF THE NUGGET [mm]/(SHEET THICKNESS [mm])$^{1/2}$

The invention claimed is:

1. A method of forming a spot welded joint, comprising:
providing a plurality of overlapping steel sheets containing 0.001% to 0.05% of P; and
forming a nugget in an overlapped face of the plurality of the overlapping steel sheets, wherein the spot welded joint is formed by:
performing a main energizing process with a current value $I_w$ (kA) for energizing time $t_w$ (msec) while applying a welding pressure,
after performing the main energizing process, performing a solidification process by retaining an energizing with a current value $I_s$ (kA) satisfying an Expression (1) for an energizing time $t_s$ (msec) satisfying an Expression (2) while maintaining the welding pressure, and
after performing the solidification process, performing a post energizing process with a current value $I_p$ (kA) satisfying an Expression (3) for an energizing time $t_p$ (msec) satisfying an Expression (4), the energizing time $t_p$ being 60 msec or longer, wherein the Expressions comprise:

$$0 \leq I_s \leq (1/2)^{1/2} \times I_w \quad (1),$$

$$\alpha^2 \times \{2 \times (I_s^2/I_w^2) + 1\} \times h \leq t_s \leq 3 \times \alpha^2 \times \{2 \times (I_s^2/I_w^2) + 1\} \times h \quad (2),$$

$$I_p > 0.8 \times I_w \quad (3), \text{ and}$$

$$I_p^2 \times t_p \leq I_w^2 \times t_w \quad (4),$$

where h is an average sheet thickness in terms of mm of the plurality of the overlapping steel sheets, and a is a nugget diameter (mm)/(h(mm))$^{1/2}$.

2. The method according to claim 1, wherein a tensile strength of the plurality of the overlapping steel sheets is 750 MPa to 2500 MPa.

3. The method according to claim 1, wherein a diameter of the nugget in terms of mm is 3×h$^{1/2}$ to 7×h$^{1/2}$.

* * * * *